United States Patent
Bartlow et al.

(10) Patent No.: US 8,384,228 B1
(45) Date of Patent: Feb. 26, 2013

(54) PACKAGE INCLUDING WIRES CONTACTING LEAD FRAME EDGE

(75) Inventors: Howard Bartlow, Longmont, CO (US);
William McCalpin, Boulder, CO (US);
Binh Le, Longmont, CO (US)

(73) Assignee: Triquint Semiconductor, Inc.,
Hillsboro, OR (US)

( * ) Notice: Subject to any disclaimer, the term of this patent is extended or adjusted under 35 U.S.C. 154(b) by 101 days.

(21) Appl. No.: 12/432,645

(22) Filed: Apr. 29, 2009

(51) Int. Cl.
*H01L 23/495* (2006.01)
*H01L 23/48* (2006.01)
*H01L 23/52* (2006.01)
*H01L 29/40* (2006.01)

(52) U.S. Cl. ........ 257/784; 257/666; 257/669; 257/674; 257/773; 257/E23.141

(58) Field of Classification Search .................. 257/784, 257/666, 669, 674, 690, 735, 773, E23.024, 257/E23.033, E23.141
See application file for complete search history.

(56) References Cited

U.S. PATENT DOCUMENTS

| | | | | |
|---|---|---|---|---|
| 3,223,903 | A * | 12/1965 | Solomon | 257/41 |
| 5,638,596 | A * | 6/1997 | McCormick | 29/827 |
| 5,689,135 | A * | 11/1997 | Ball | 257/676 |
| 5,917,235 | A * | 6/1999 | Imura | 257/669 |
| 6,175,159 | B1 * | 1/2001 | Sasaki | 257/778 |
| 6,184,580 | B1 | 2/2001 | Lin | |
| 6,191,473 | B1 * | 2/2001 | Distefano | 257/691 |
| 6,320,267 | B1 * | 11/2001 | Yukawa | 257/783 |
| 6,323,551 | B1 * | 11/2001 | Anzai | 257/737 |
| 6,329,714 | B1 * | 12/2001 | Guillot | 257/723 |
| 6,437,452 | B2 * | 8/2002 | Lin | 257/784 |
| 6,441,474 | B2 * | 8/2002 | Naitoh et al. | 257/678 |
| 6,474,532 | B2 * | 11/2002 | Bettinger et al. | 228/110.1 |
| 6,506,629 | B1 | 1/2003 | Kinsman | |
| 6,509,631 | B2 * | 1/2003 | Toyosawa | 257/668 |
| 6,525,412 | B2 * | 2/2003 | Noshita | 257/678 |
| 6,576,983 | B1 * | 6/2003 | Fazelpour et al. | 257/666 |
| 6,586,845 | B1 | 7/2003 | Higashi | |
| 6,967,395 | B1 * | 11/2005 | Glenn et al. | 257/676 |
| 6,977,427 | B2 * | 12/2005 | Hetzel et al. | 257/676 |
| RE40,061 | E * | 2/2008 | Ball | 438/109 |
| 7,365,421 | B2 * | 4/2008 | Webster et al. | 257/704 |
| 7,498,664 | B2 | 3/2009 | Ito | |

(Continued)

FOREIGN PATENT DOCUMENTS

JP 56019632 A * 2/1981
JP 04330744 A * 11/1992

(Continued)

OTHER PUBLICATIONS

Final Office Action in U.S. Appl. No. 12/431,690 dated Aug. 16, 2012.

(Continued)

*Primary Examiner* — Teresa M Arroyo
(74) *Attorney, Agent, or Firm* — Schwabe Williamson & Wyatt

(57) ABSTRACT

Embodiments of a microelectronic package are generally described herein. A microelectronic package may include a lead frame including a major surface, and a die having including a bond pad. A wire may electrically couple a location of the major surface of the lead frame with the bond pad of the die, the wire being situated such that the wire is substantially unbent from the location of the major surface to an edge of the lead frame.

13 Claims, 5 Drawing Sheets

U.S. PATENT DOCUMENTS

| | | | |
|---|---|---|---|
| 2001/0017412 A1* | 8/2001 | Asazu et al. | 257/737 |
| 2001/0028116 A1* | 10/2001 | Jiang | 257/779 |
| 2001/0054751 A1* | 12/2001 | Toyosawa | 257/668 |
| 2002/0066963 A1* | 6/2002 | Embong et al. | 257/784 |
| 2002/0070431 A1* | 6/2002 | Misumi et al. | 257/666 |
| 2002/0072214 A1* | 6/2002 | Yuzawa et al. | 438/613 |
| 2004/0238934 A1 | 12/2004 | Warner | |
| 2004/0245651 A1 | 12/2004 | Nishisako | |
| 2005/0116335 A1 | 6/2005 | Karim | |
| 2006/0086899 A1* | 4/2006 | Chao et al. | 250/239 |
| 2006/0157830 A1* | 7/2006 | Hoag | 257/668 |
| 2007/0158392 A1* | 7/2007 | Shimanuki | 228/101 |
| 2007/0257343 A1 | 11/2007 | Hauenstein | |
| 2008/0099895 A1* | 5/2008 | Kwak | 257/676 |
| 2008/0246129 A1* | 10/2008 | Oga | 257/673 |
| 2009/0001608 A1* | 1/2009 | Mii et al. | 257/780 |
| 2009/0168386 A1 | 7/2009 | Suzuki | |
| 2010/0052130 A1* | 3/2010 | Hwang et al. | 257/685 |

FOREIGN PATENT DOCUMENTS

| | | |
|---|---|---|
| JP | 05121625 A * | 5/1993 |
| JP | 06021137 A * | 1/1994 |

OTHER PUBLICATIONS

Non-Final Office Action in U.S. Appl. No. 12/431,690 dated Jun. 27, 2011.

Final Office Action in U.S. Appl. No. 12/431,690 dated Dec. 23, 2011.

Non-Final Office Action in U.S. Appl. No. 12/431,690 dated Apr. 25, 2012.

* cited by examiner

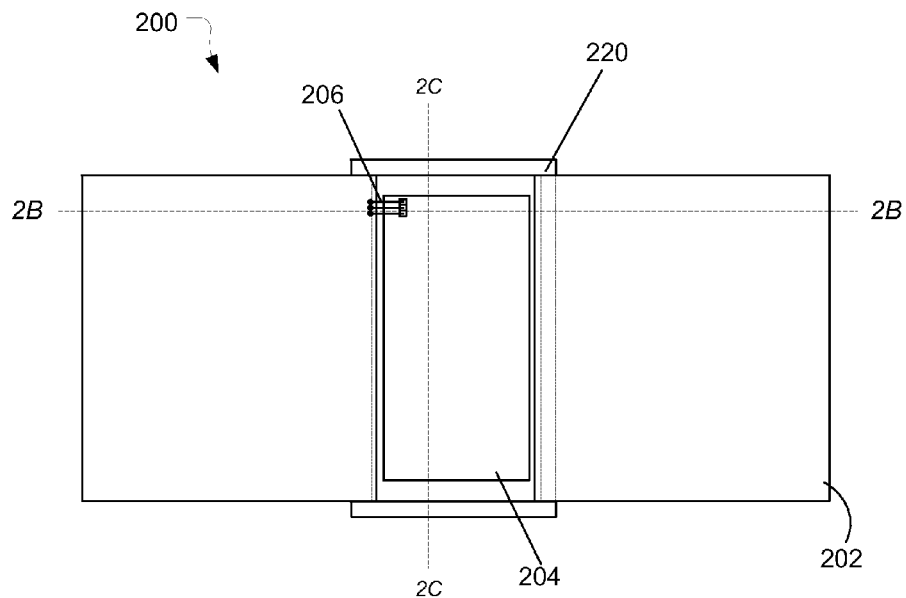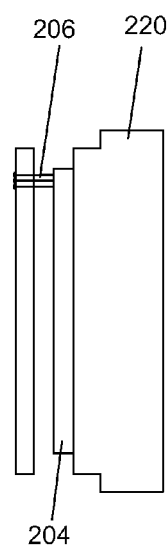
Figure 2A
Figure 2C
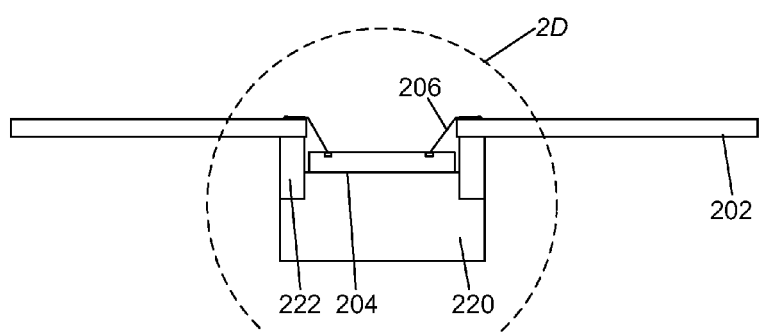
Figure 2B

PACKAGE INCLUDING WIRES CONTACTING LEAD FRAME EDGE

TECHNICAL FIELD

Embodiments of the present disclosure relate generally to microelectronic packaging, and more particularly, to packages including wires contacting a lead frame edge.

BACKGROUND

Microelectronic packages typically include one or more die coupled to a lead frame, with the lead frame forming the pin-out of the package. The die is electrically connected with the lead frame, and thus, to components external to the package, by electrically connecting the bond pads of the die with bond pads of the lead frame.

In a number of applications, the bond pads of the die are wire-bonded to the lead frame. Illustrated in FIG. 1 is an example related-art package including a die 104 mounted on a base 120, which is coupled to a lead frame 102 by a dielectric material 122. Wires 106 are bonded to the lead frame 102, then looped up and away from the lead frame 102, and then bonded to a bond pad 112 of the die 104, or vice versa. The resulting looped wire 106 is curved and loose (i.e., the wire is not taut), generally with the aim of avoid stressing and breakage of the wire 106. Moreover, the wire 106 may be 30 mils or more in length, and oftentimes, upwards of 180 mils or more.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments of the disclosure are illustrated by way of example and not by way of limitation in the figures of the accompanying drawings.

FIGS. 2A-2C are plan, cross-sectional side, and cross-sectional end views, respectively, of a microelectronic package in accordance with various embodiments.

DETAILED DESCRIPTION

Figure 1:
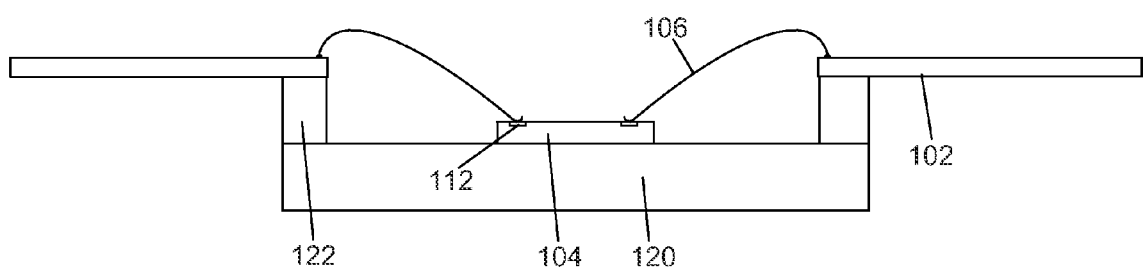
FIG. 1 is a cross-sectional view of a related-art microelectronic package.
Figure 2D:
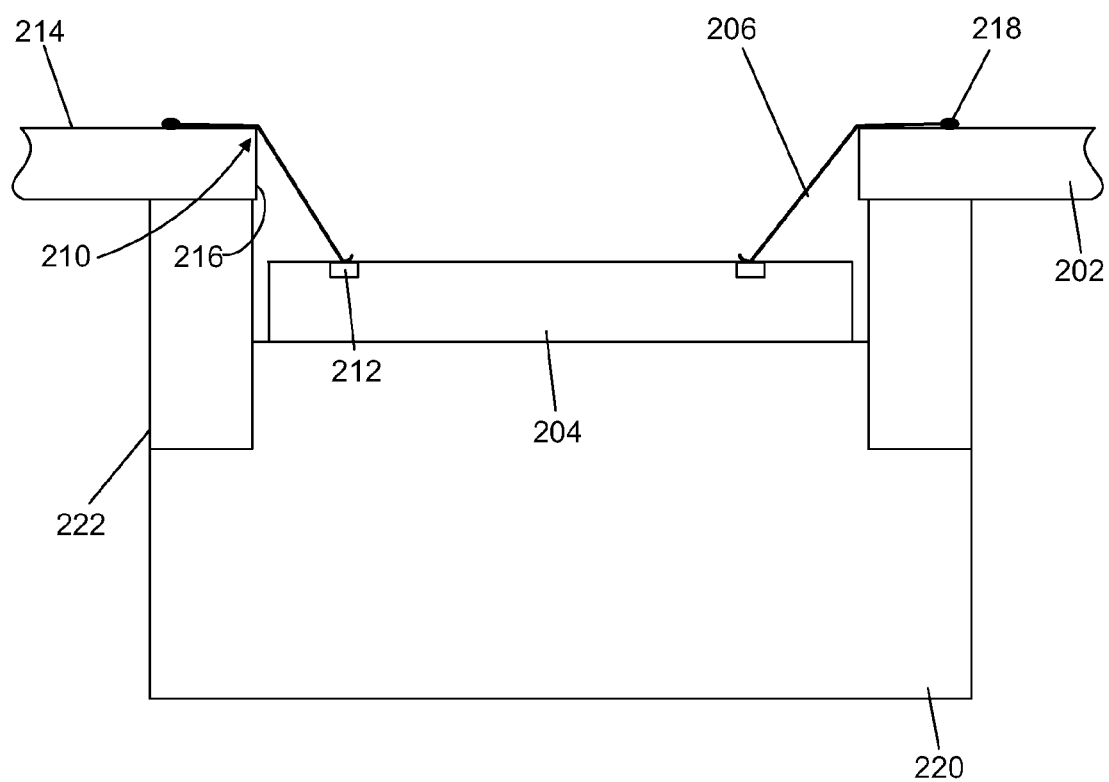
FIG. 2D is a detailed view of FIG. 2C.

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

For the purposes of the present invention, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element. In addition, although embodiments of the present invention may be shown and described as including a particular number of components or elements, embodiments of the invention are not limited to any particular number of components or elements.

Turning now to FIGS. 2A-2D, illustrated are views of an exemplary microelectronic package 200 including a lead frame 202 and a die 204. The die 204 includes a plurality of bond pads 212. A wire 206 electrically couples the lead frame 202 with the die 204. For clarity, only three wires, and only on one side of the die 204, are depicted in the drawings. It is expected, however, that packages in accordance with embodiments described herein may include more wires and along two or more edges of the die 204.

As illustrated, the wire 206 is situated such that the wire 206 is pulled substantially directly towards and over the edge 210 of the lead frame 202 such that the wire 206 contacts the edge 210 of the lead frame 202. Rather than being in a looped configuration, the wire 206 is instead substantially unbent between the point at which the wire 206 is bonded to the lead frame 202 and the edge 210 of the lead frame 102, and between the edge 210 of the lead frame 202 and a bond pad 212 of the die 204. It is noted that in various embodiments, the wire 206 may naturally experience a degree of sagging at some time after the wire 206 is bonded to the lead frame 202 and the die 204, while remaining substantially unbent.

By configuring the wire 206 such that the wire 206 is substantially unbent between the point at which the wire 206 is bonded to the lead frame 202 and the edge 210 of the lead frame 202, and between the edge 210 of the lead frame 202 and a bond pad 212 of the die 204, it is possible to use a shorter wire 206 than would be possible in configurations in which the wire 206 is looped in a curved fashion (such as, for example, the package illustrated in FIG. 1). In some embodiments, the wire 106 may be about 9 mils or less from the edge 210 of the lead frame 202 to the bond pad 212 of the die 204. Contrary to convention, it has been discovered that at least for some applications, the wire 206 in accordance with the embodiments described herein may provide sufficient resilience in the event the package 200 experiences any warpage or thermal expansion.

Moreover, by reducing the length of the wire 206, the parasitic series inductance of the electrical connections to the die 204 may be similarly reduced. Accordingly, embodiments of the present disclosure may be particularly advantageous in high power radio-frequency applications in which the package 200 may be a high-power transistor package and the die 204 comprises one or more radio-frequency power transistors. By reducing series inductance in these applications, superior radio-frequency performance may be attainable over multi-octave frequency bandwidths and with excellent efficiency, power, and gain.

In some embodiments, the wire 206 may also contact the lead frame 202 between the point at which the wire 206 is bonded to the lead frame 202 and the edge 210. The extent of the contact, if any, by the wire 206 with the lead frame 202 between the point at which the wire 206 is bonded to the lead frame 202 and the edge 210 may depend upon where the wire 206 is bonded to the lead frame 202. If, for example, the wire 206 is bonded to the lead frame 202 farther away from the edge 210 of the lead frame 202 than that illustrated, it is conceivable that the wire 206 may make contact with a portion of the lead frame 202 between the point at which the wire 206 is bonded to the lead frame 202 and the edge 210.

It should be noted that as used herein, the edge 210 may refer generally to the points at which surfaces of the lead frame 202 meet. More particularly, the edge 210 may be defined as the area generally along the corner formed by the intersection of a major surface 214 and a minor surface 216 of the lead frame 202.

The lead frame 202 may be coplanar or non-coplanar with the die 204. As illustrated, the lead frame 202 is non-coplanar with the die 204, with the die 204 being down-set relative to the lead frame 202. In this configuration, the wires 206 may be bent at the edge 210 of the lead frame 202. The bend in the wire 206 at the edge of the lead frame 202 may result from the wire 206 being pulled substantially taut as the wire 206 traverses the edge 210 of the lead frame 202.

Figure 3:
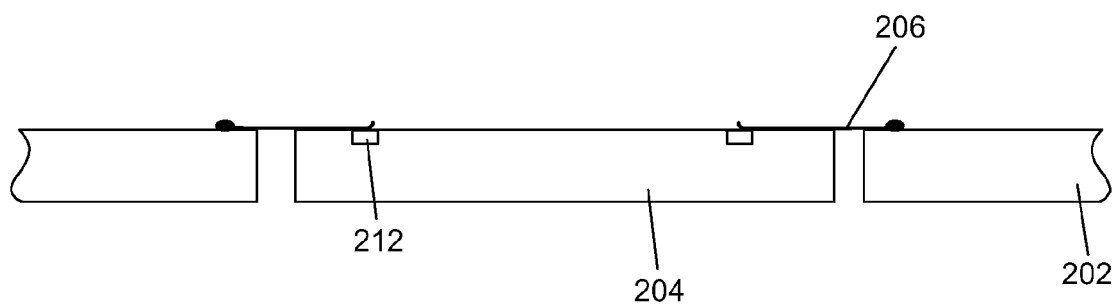
FIG. 3 is a cross-sectional side view of another microelectronic package in accordance with various embodiments.

In some embodiments, the die 204 may be substantially co-planar with the lead frame 202 (i.e., not down-set), as illustrated in FIG. 3. In these embodiments, the wire 206 may be substantially unbent between the point at which the wire 206 is bonded to the lead frame and the bond pads of the die 204.

Referring again to FIGS. 2A-2D, the wire 206 may be formed using any conventional wire-bonding method. In various embodiments, for instance, the wire 206 may be formed using a wire-bonder. The wire-bonder may be equipped with wire of an appropriate conductive material (e.g., gold, aluminum, or the like), and an end of the wire may be melted to form a conductive bump 218 (also sometimes referred to as a weldment). The conductive bump 218 may be welded to the lead frame 202 (or to the bond pad 212 of the die 204), and then the wire 206, still connected to the conductive bump 218, may be bonded to the bond pad 212 of the die 204 (or to the lead frame 202) by way of a wedge bond. Other methods for bonding the wire 206 to the lead frame 202 and the die 204 may be similarly suitable.

The die 204 may be mounted onto a supporting structure to provide mechanical support for the die 204 or protect the die 204 from damage that could occur if the die 204 were left exposed. For example, the die 204 may be mounted onto a flange 220. The flange 220 may be electrically coupled with the die 204, and may provide an electrical ground path to which the die 206 may couple. The flange 220 may also provide heat spreading for the package 200. In various other embodiments, a die paddle (not illustrated) may be similarly suitable.

The flange 220 may be coupled to the lead frame 202 using a bonding ring 222 as illustrated. The bonding ring 222 may be configured with a thickness to provide a sufficient clearance between the die 204 and the lead frame 202. The bonding ring 222 may, in various embodiments, provide additional mechanical reinforcement to the package 200.

Although not illustrated, the package 200 may further include a lid and/or encapsulation for sealing the die 204.

Figure 4:
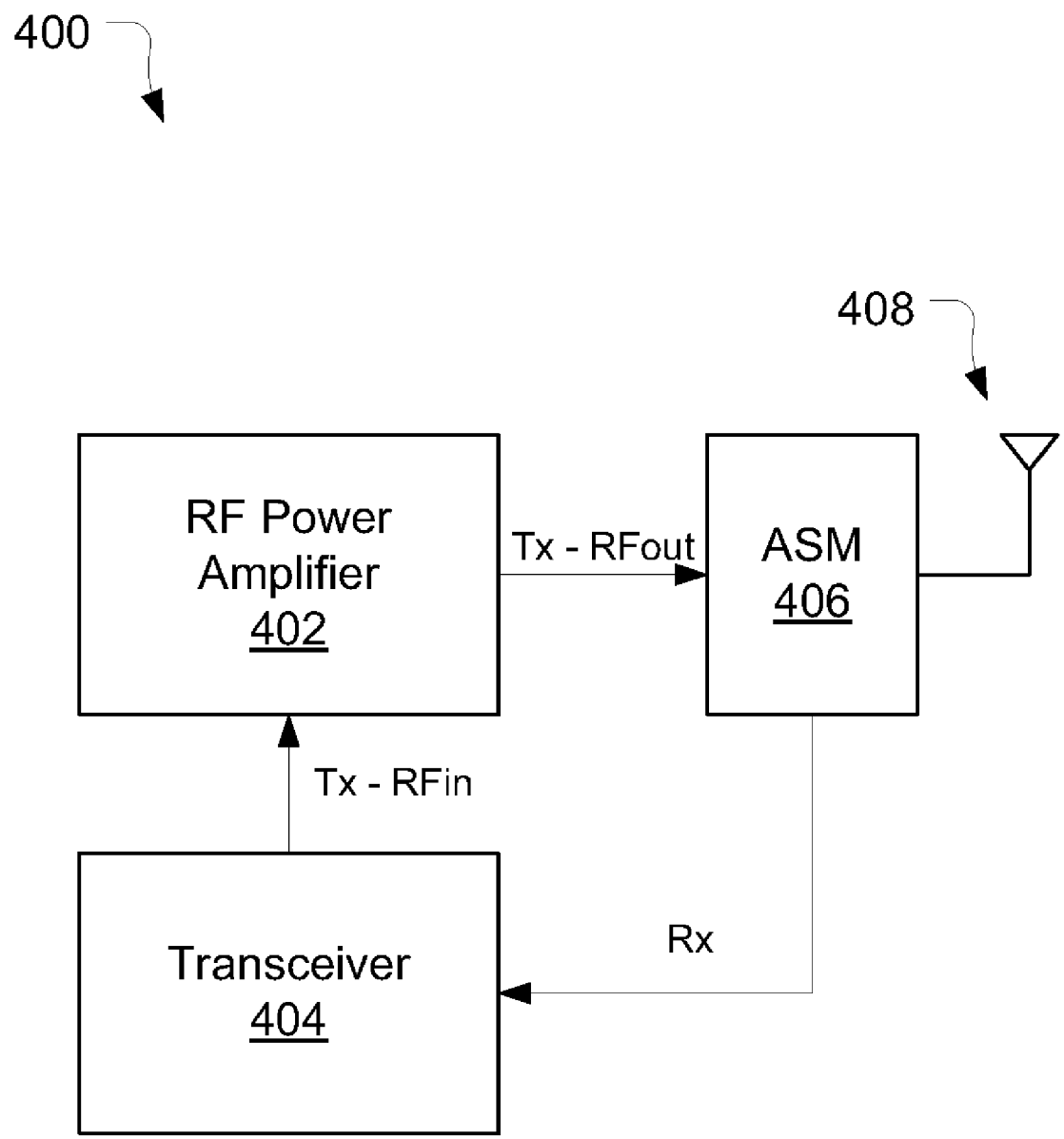
FIG. 4 is a block diagram of a system in accordance with various embodiments.

Embodiments of packages described herein may be incorporated into various apparatuses and systems. A block diagram of an exemplary system 400 is illustrated in FIG. 4. As illustrated, the system 400 includes a radio frequency (RF) power amplifier 402 including a package in accordance with various embodiments of the present invention. The system 400 may include a transceiver 404 coupled with the RF power amplifier 402 as shown.

The RF power amplifier 402 may receive an RF input signal, RFin, from the transceiver 404. The RF power amplifier 402 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 4.

The amplified RF output signal, RFout, may be provided to an antenna switch module (ASM) 406, which effectuates an over the air (OTA) transmission of the RF output signal, RFout, via an antenna structure 408. The ASM 406 may also receive RF signals via the antenna structure 408 and couple the received RF signals, Rx, to the transceiver 404 along a receive chain.

In various embodiments, the antenna structure 408 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 400 may be any system including power amplification. In various embodiments, the system 400 may be particularly useful for power amplification at high radio frequency power and frequency. For example, the system 400 may be suitable for any one or more of terrestrial and satellite communications, radar systems, and possibly in various industrial and medical applications. Radar applications may include military-use radar, air traffic control, navigation, and the like.

In various embodiments, the system 400 may be a selected one of a radar device, a satellite communication device, a mobile handset, a cellular telephone base station, a broadcast radio, or a television amplifier system. The system 400 may find applicability in other applications in which power amplification for high frequency transmission and/or reception is required.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:
1. An apparatus comprising:
a lead frame including a major surface delimited by an edge of the lead frame;
a die including a bond pad; and
a wire in direct contact with the edge of the major surface of the lead frame and electrically coupling the edge with the bond pad of the die, wherein the wire is angled at the edge of the lead frame and is substantially uncurved and unbent from the edge to the bond pad.

2. The apparatus of claim 1, wherein the wire is coupled with a location on the major surface of the lead frame, and wherein the wire directly contacts the major surface of the lead frame between the location of the major surface and the edge of the lead frame.

3. The apparatus of claim 2, wherein the wire is substantially uncurved and unbent from the location on the major surface to the edge of the lead frame.

4. The apparatus of claim 1, wherein the die is down-set relative to the lead frame.

5. The apparatus of claim 1, wherein the wire is substantially straight from the edge of the lead frame to the bond pad of the die.

6. The apparatus of claim 1, wherein the wire includes an angled bend directly contacting the edge of the lead frame.

7. A method comprising:
   providing a lead frame including a major surface delimited by an edge of the lead frame, and a die including a bond pad;
   extending a wire over the edge of the lead frame such that the wire is in direct contact with and angled at the edge; and
   coupling the wire with the bond pad of the die so that the wire electrically couples the bond pad to the edge and is situated such that the wire is substantially uncurved and unbent from the edge to the bond pad.

8. The method of claim 7, further comprising coupling the wire with a location on the major surface of the lead frame, and wherein the extending the wire over the edge comprises situating the wire such that the wire directly contacts the major surface of the lead frame between the location of the major surface and the edge of the lead frame.

9. The method of claim 7, further comprising coupling the wire to a location on the major surface of the lead frame, and wherein the extending the wire of the edge comprises situating the wire such the wire is substantially uncurved and unbent from the location on the major surface to the edge of the lead frame.

10. The method of claim 7, wherein the providing of the lead frame and the die comprises down-setting the die relative to the lead frame.

11. The method of claim 7, wherein the coupling the wire comprises coupling the wire with the bond pad of the die such that the wire is substantially straight from the edge of the lead frame to the bond pad of the die.

12. The method of claim 9, wherein the extending the wire over the edge comprises extending the wire over the edge such that the wire is substantially straight from the location on the major surface to the edge of the lead frame.

13. The method of claim 7, wherein the extending the wire over the edge of the lead frame forms an angled bend in the wire, the angled bend directly contacting the edge of the lead frame.

\* \* \* \* \*